(12) United States Patent
Word et al.

(10) Patent No.: US 8,539,393 B2
(45) Date of Patent: Sep. 17, 2013

(54) SIMULATION AND CORRECTION OF MASK SHADOWING EFFECT

(75) Inventors: James C Word, Portland, OR (US); Konstantinos G Adam, Belmont, CA (US); Michael Lam, Sunnyvale, CA (US); Sergiy Komirenko, Cupertino, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/244,070

(22) Filed: Sep. 23, 2011

(65) Prior Publication Data

US 2013/0080982 A1    Mar. 28, 2013

(51) Int. Cl.
*G06F 17/50*    (2006.01)

(52) U.S. Cl.
USPC ................... 716/54; 716/51; 716/52; 716/53; 716/55

(58) Field of Classification Search
USPC .............................. 716/50, 51, 52, 53, 54, 55
See application file for complete search history.

(56) References Cited

U.S. PATENT DOCUMENTS 5,153,587 A * 10/1992 Redlich ........................ 340/947
2007/0213962 A1 * 9/2007 Adam ................................ 703/2

OTHER PUBLICATIONS

Eric HendrickX, Gian F. Lorusso, Jiong Jiang, Luoqi Chen, Wei Lui, Eelco Van Setten, Steve Hansen "Accurate models for EUV Lithography" Proc. of SPIE vol. 7488, 74882G, 2009.*

Philip C. W. Ng, Kuen-Yu Tsai, Yen-Min Lee, Ting-Han Pei, Fu-Min Wang, Jai-Han Li, and Alek C. Chen "A full Model-Based Methodology for Simulataneously Correcting EUV Mask Shadowing and Optical Proximity Efects with Imporoved Pattern Transfer Fidelity and Process Windows" Proc. of SPIE vol. 7520, 2009.*
Michael Christopher Lam "Fast Simulation Methods for Non-Planar Phase and Multilayer Defects in DUV and EUV Photomasks for Lithography" University of California, Berkeley, Fall 2005.*
K. Adam, "Domain Decomposition Methods for the Electromagnetic Simulation of Scattering from Three-Dimensional Structures with Applications in Lithography," Electronics Research Laboratory, University of California, Berkeley, 2001.
K. Adam and M.C. Lam, "Hybrid Hopkins-Abe Method for Modeling Oblique Angle Mask Effects in OPC," Proceedings of SPIE, vol. 6924 (2008).
P.C.W. Ng, et al. "Fully model-based methodology for simultaneous correction of extreme ultraviolet mask shadowing and proximity effects," J. Micro/Nanolith. MEMS MOEMS 10(1), 013004 (Jan.-Mar. 2011).
G.L. Fenger et al., "Design correction in extreme ultraviolet lithography,"J. Micro/Nanolith. MEMS MOEMS 9(4), 043001 (Oct.-Dec. 2010).
H. Song, et al. "Shadowing effect modeling and compensation for EUV lithography," Proceedings of SPIE, vol. 7969 (2011).
C. Zuniga, et al. "EUV Flare and Proximity Modeling and Model-based Correction,"Proceedings of SPIE, vol. 7969 (2011).

* cited by examiner

*Primary Examiner* — Thuan Do
*Assistant Examiner* — Brian Ngo
(74) *Attorney, Agent, or Firm* — Klarquist Sparkman, LLP

(57) ABSTRACT

Disclosed are techniques for simulating and correcting the mask shadowing effect using the domain decomposition method (DDM). According to various implementations of the invention, DDM signals for an extreme ultraviolet (EUV) lithography mask are determined for a plurality of azimuthal angles of illumination. Base on the DDM signals, one or more layout designs for making the mask may be analyzed and/or modified.

20 Claims, 6 Drawing Sheets

SIMULATION AND CORRECTION OF MASK SHADOWING EFFECT

FIELD OF THE INVENTION

The present invention relates to the field of lithography. Various implementations of the invention may be useful for simulating and correcting the mask shadowing effect.

BACKGROUND OF THE INVENTION

Extreme ultraviolet (EUV) lithography is a leading candidate for the next-generation lithographic solution. The current optical irradiation wavelength for EUV lithography is 13.5 nm. The prototypes operational in the field have demonstrated the feasibility of fabricating 32- and 22-nm node devices. Unlike deep ultraviolet (DUV) lithography systems such as the 193 nm system, EUV lithography systems cannot use refractive optical elements because of strong material absorption at the EUV wavelength. Instead, reflective optical elements such as mirrors are needed. EUV masks also need to work in a reflective mode.

A typical EUV projection printing system includes multiple mirrors. At the mask plane, the chief ray is off-axis by roughly 6 degrees but is perpendicular to the image plane (wafer plane). Thus, the system is telecentric at the wafer plane, but non-telecentric at the mask plane. The illuminated field on the mask plane is arc-shaped spanning about ±22 degrees from the plane of incidence, as illustrated in FIG. 3a. The plane of incidence is defined by the surface normal of the mask plane and the illumination light ray. The size of the illuminated field is about 1×22 mm². The combination of non-telecentricity at the mask plane and mask topography cause a unique problem for the EUV lithography—the mask shadowing effect. The mask shadowing effect is schematically shown in FIG. 3b. Shadows are formed around patterns represented by the absorber shapes and make them wider in the near field image of the mask. This mask pattern widening is passed on to the wafer image through the imaging optics. The mask shadowing effect is asymmetric with respect to horizontal and vertical features. As a result, critical area (CD) bias and position shift will occur if not corrected.

As with other systematic patterning errors, the shadowing effect should be compensated for in the EUV lithographic process. Conventional compensation methods may be rule based or model based. In a simple rule-based method, for example, a single bias correction to all features is applied. This method does not take account of variations of the shadowing effect across the illuminated field, i.e., the azimuthal angle dependence of the shadowing effect. Moreover, most rule-based compensation methods are empirically developed with simple Manhattan patterns and thus do not work well with complicated geometric patterns. Rigorous modeling of the mask shadowing effect can provide better correction results. They are, however, computationally expensive and thus impractical in many applications. Therefore, it is desirable to develop an efficient method for modeling and correcting the mask shadowing effect.

BRIEF SUMMARY OF THE INVENTION

Aspects of the invention relate to techniques for simulating and correcting the mask shadowing effect using the domain decomposition method (DDM). According to various implementations of the invention, DDM signals for an extreme ultraviolet (EUV) lithography mask are determined for a plurality of azimuthal angles of illumination. The DDM signals may be edge-based DDM signals. Based on the DDM signals, one or more layout designs are processed. The processing can be any analysis/modification of the one or more layout designs in which one or more types of the processing results may be obtained: aerial image intensities, edge placement errors and mask displacement.

In some embodiments of the invention, DDM signals are determined based on simulation for a subset of the plurality of azimuthal angles of illumination. These DDM signals are referred to as simulated DDM signals. DDM signals for the rest of the plurality of azimuthal angles of illumination, referred to as interpolated DDM signals, are determined based on interpolating the simulated DDM signals.

In some other embodiments of the invention, DDM signals are determined based on simulation for a subset of the plurality of azimuthal angles of illumination. Based on the DDM signals, one or more layout designs are processed for the subset of the plurality of azimuthal angles of illumination. Processing results for the rest of the plurality of azimuthal angles of illumination are determined based on interpolating the processing results for the subset of the plurality of azimuthal angles of illumination.

DETAILED DESCRIPTION OF THE INVENTION

General Considerations

Figure 1:
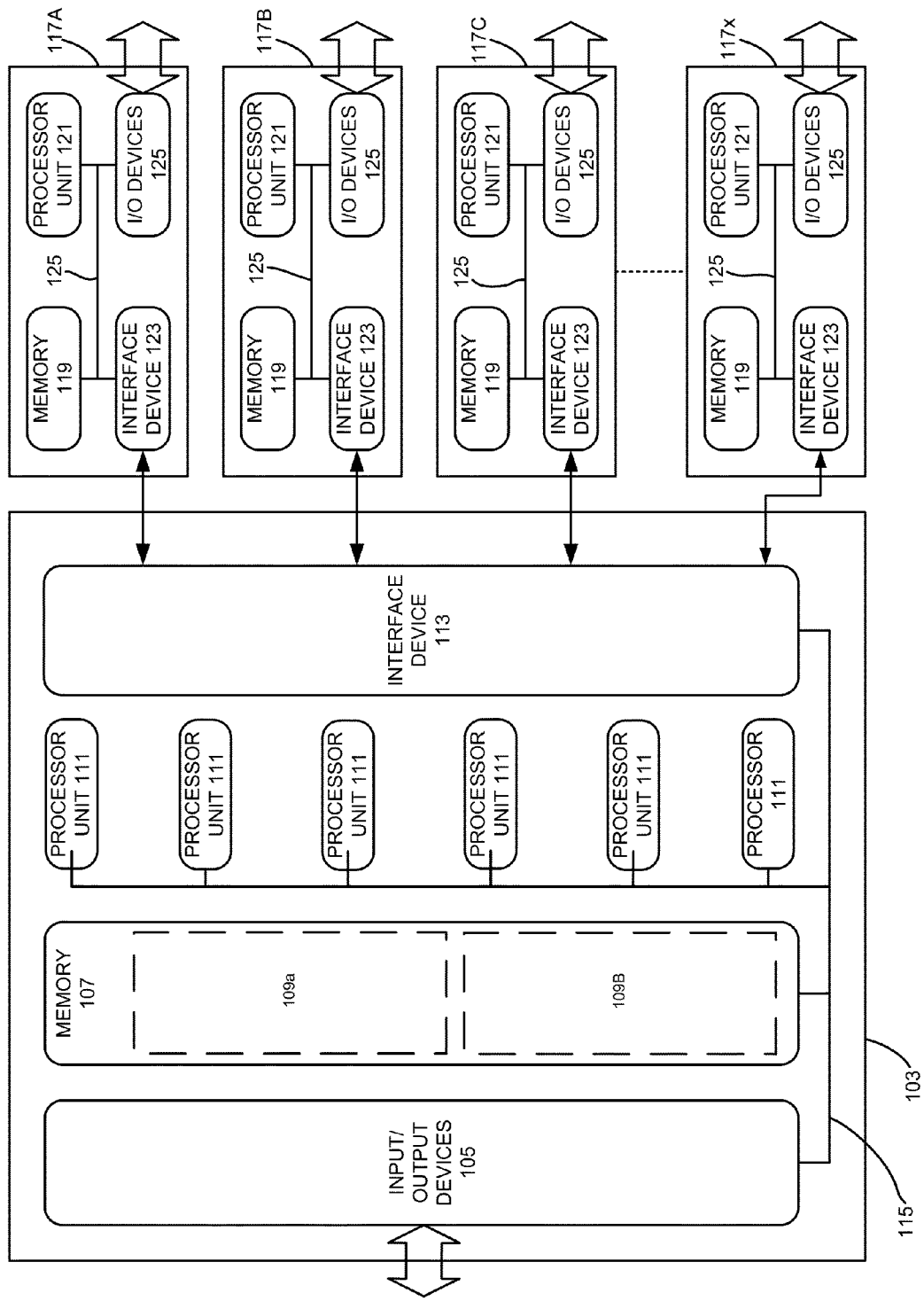
FIG. 1 illustrates an example of a computing system that may be used to implement various embodiments of the invention.

Various aspects of the present invention relate to modeling and/or correcting flare effects in lithography. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
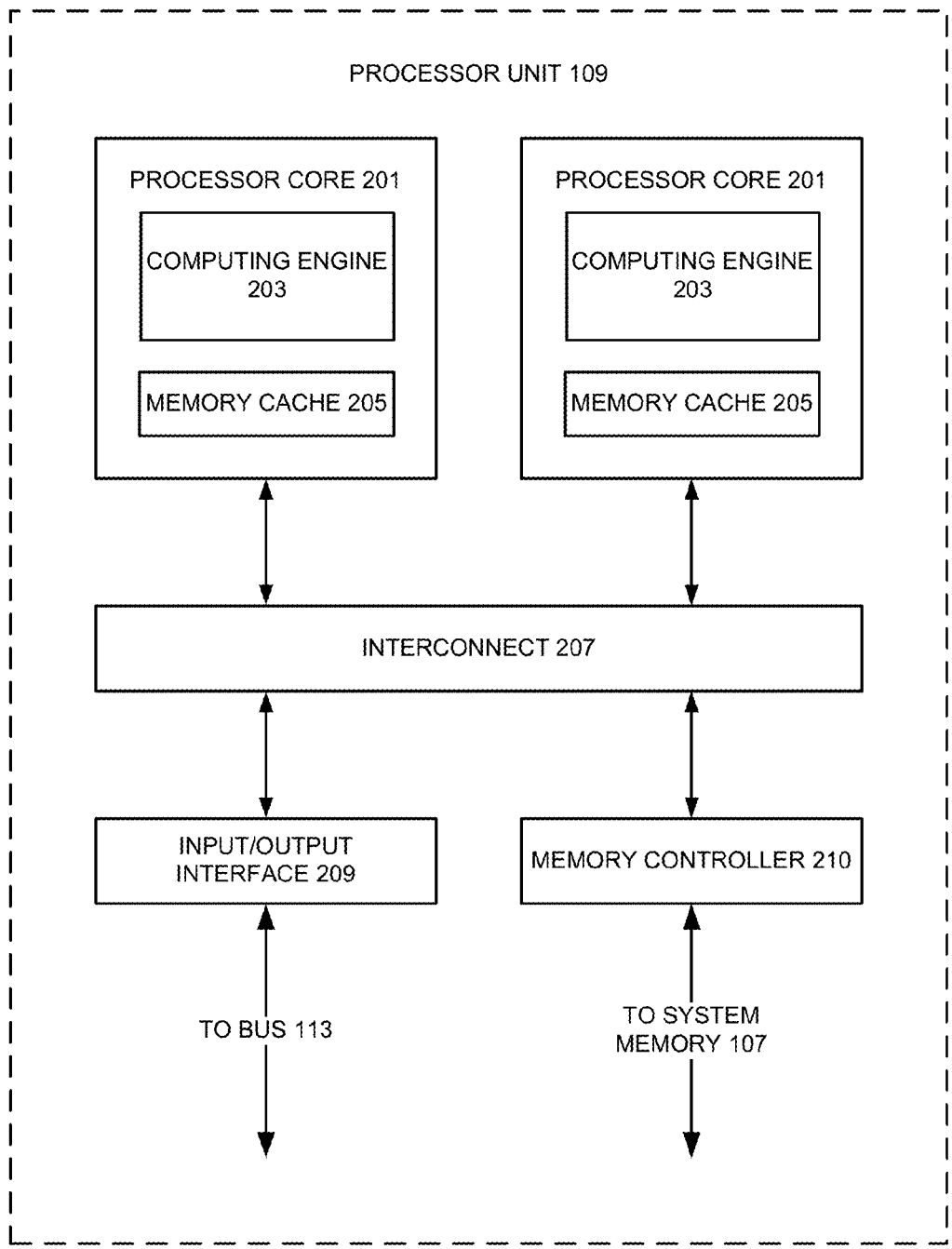
FIG. 2 illustrates an example of a multi-core processor unit that may be used to implement various embodiments of the invention.
Figure 3A:
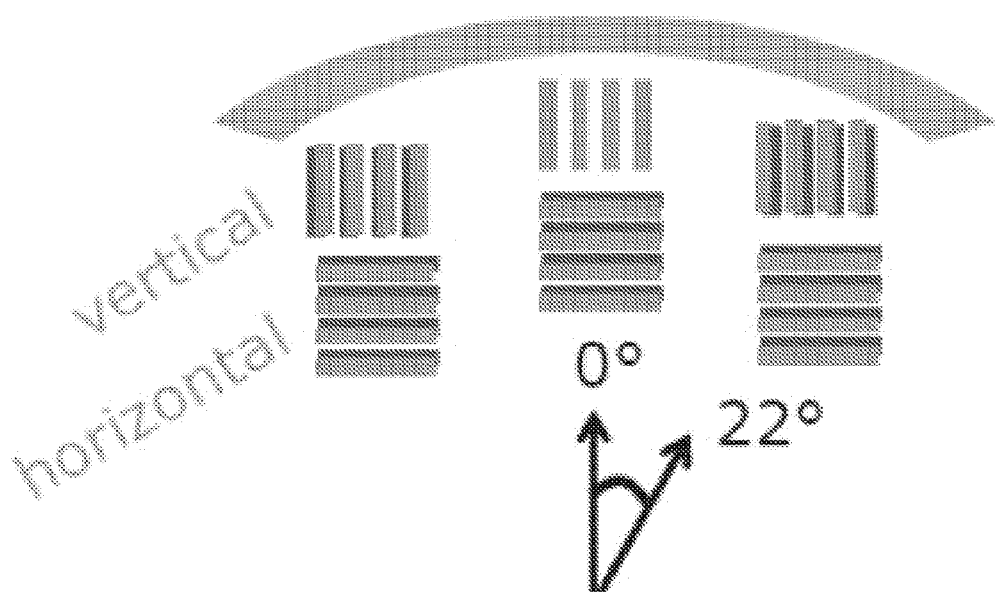
FIG. 3a illustrates an example of the illuminated field on the mask plane.
Figure 3B:
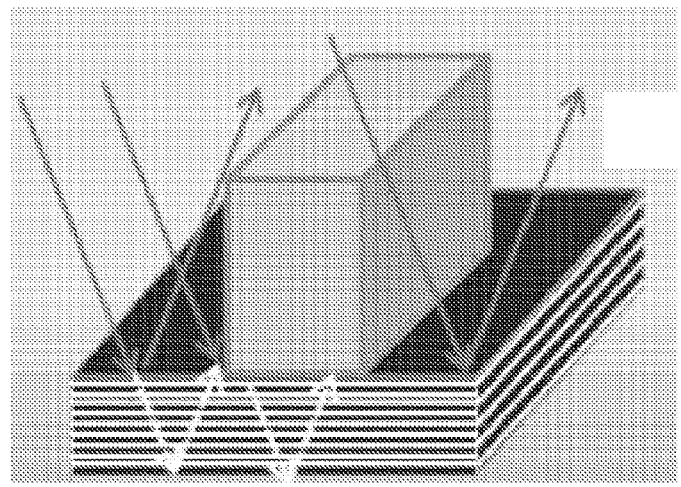
FIG. 3b illustrates an example of the mask shadowing effect.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Domain Decomposition Methods (DDMs)

When the illumination of an object originates from a quasi-monochromatic, spatially incoherent light source, as is the case in lithography systems, there exists a method for calculating the image intensity that has the special appeal of conceptual simplicity. First, each point on the light source is considered individually and the image intensity produced by the light emitted from that single point is calculated. Then, the image intensity contributions from all points that comprise the light source are added, with a weighting factor proportional to the source intensity distribution. Simple addition or integration of the image intensity distributions can be performed, since the original source is assumed to be spatially incoherent. This is the theory proposed by Abbe, and the image intensity $I_i$ at point (u,v) can be computed using the following integral:

$$I_i(u, v) = \qquad\qquad\qquad\qquad\qquad\qquad\qquad\qquad \text{Eq. 1}$$

$$\int\int_{-\infty}^{\infty} I_s(\alpha, \beta) \int\int_{-\infty}^{\infty} \int\int K(u, v; x_1, y_1) K^*(u, v; x_2, y_2) \times$$

$$F(x_1, y_1; \alpha, \beta) F^*(x_2, y_2; \alpha, \beta) T_o(x_1, y_1)$$

$$T_o^*(x_1, y_1) T_o^*(x_2, y_2) dx_1 dy_1 dx_2 dy_2 d\alpha d\beta$$

where $I_s$ is the source intensity, F and K are amplitude spread functions of the illuminating and imaging systems respectively, $T_o$ is the amplitude transmittance of the object (mask) and the asterisk represents complex conjugation.

In the theory proposed by Hopkins the image intensity calculation can alternatively be performed by using the following integral:

$$I_i(u, v) = \qquad\qquad\qquad\qquad\qquad\qquad\qquad\qquad \text{Eq. 2}$$

$$\int\int_{-\infty}^{\infty} \int\int \left[ \int\int_{-\infty}^{\infty} \overline{J}_o(f, g) \overline{K}(f+f, g+g') \overline{K}^*(f+f'', g+g'') \right.$$

$$\left. df dg \right] \times \overline{T}_o(f', g') \overline{T}_o^*(f'', g'')$$

$$e^{-j2\pi[(f'-f'')u+(g'-g'')v]} df' dg' df'' dg''$$

where $J_o$ is the source mutual intensity and the overbars represent Fourier transforms of the respective quantities. The image intensity $I_i$ as a function of image-space coordinates can be retrieved by the inverse Fourier transform of Eq. 2. The term inside the square brackets is often referred to as the transmission cross-coefficient (TCC) of the optical system. The TCC is independent of the object (the mask in photolithography) and is a complete description of the optical system from source to image plane. Note that the central assumption of Hopkins' theory is that the object transmission is independent of the illumination. As all illumination and imaging parameters are completely modeled in the TCC, the TCC can be pre-calculated and stored. The aerial images for mask patterns (layout patterns) can then be obtained by insert the mask transmittance function $T_0$ and the TCC into Eq. 2.

The disturbance U (any field component) at a point P behind a mask that is illuminated from a distant point source at $P_0$ can be approximated by the Kirchhoff-Fresnel diffraction integral, as shown in Eq. 3:

$$U(P) = \frac{jAe^{jkr_0}}{2\lambda r_0} \int_W \int \frac{e^{jks}}{s} (1 + \cos\chi) dS \qquad \text{Eq. 3}$$

where the integral extends over W, the mask's opening. The linearity of the Kirchhoff-Fresnel diffraction integral suggests that for a mask containing multiple openings $W_i$, the Eq. 2 becomes:

$$U(P) = \sum_i U_i(P) \qquad \text{Eq. 4}$$

where $U_i(P)$ represents disturbance caused by each opening separately. Eq. 4 illustrates the essence of the domain decomposition method (DDM): every single opening (mask feature) of a mask may be considered separately and the scattered field below the mask is found as the sum of the scattered fields below each opening.

Rigorous simulation methods may be applied to determine the electromagnetic field below the mask. The determined steady-state near field can be regarded as a rigorous complex mask transmittance function $T_0$, or the r-mask model. The r-mask model accurately describes the scattering field near the mask. However, the simulation process can be computationally expensive even for a single rectangular mask opening due to the nature of three-dimensional simulation. The mask transmittance function $T_0$ may also be approximated by a function consisting of a piecewise constant function coinciding with the ideal mask transmission properties. This mask transmittance function $T_0$ is called the k-mask model. While no simulation is needed for determining the k-mask model, the k-mask model breaks down when either the minimum layout feature or the vertical structure of the mask is comparable to the illumination wavelength.

Figure 5:
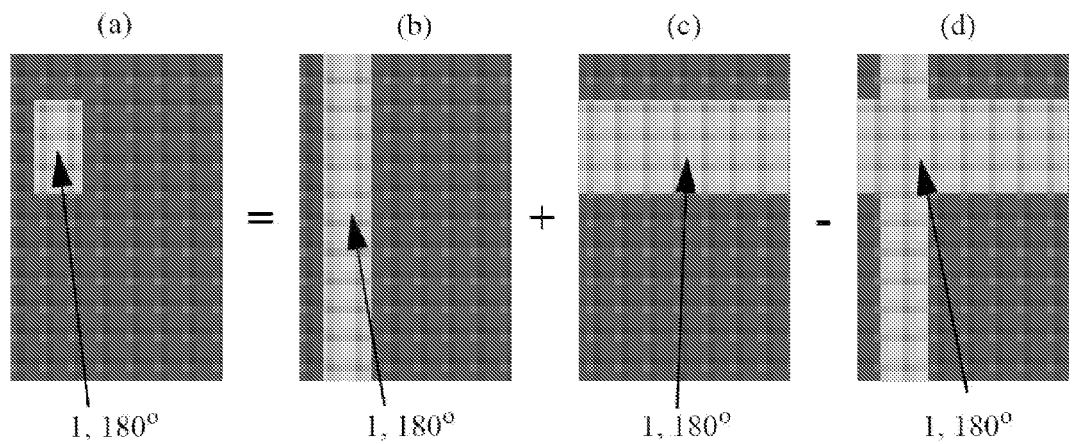
FIG. 5 illustrates an example of decomposing a mask feature.

Quasi-rigorous DDMs have been developed to achieve acceptable simulation accuracy without performing the slow three-dimensional simulation. In one quasi-rigorous DDM, each mask feature may be further decomposed into one-dimensional features and a two-dimensional k-mask feature. In FIG. 5, for example, the scattering field below the mask for feature 510 can be derived by combining the scattering fields for two one-dimensional features 520 and 530 and then subtracting the scattering field for a two-dimensional feature 540. The scattering field for feature 540 is described by a k-mask model and thus its determination requires no simulation. The scattering fields for features 520 and 530 can be obtained by executing two-dimensional simulations. To further speed up the process, the simulation results for one-dimensional features may be calculated and converted to transmission functions, i.e. the modified k-mask models. The modified k-mask models may then be stored in look-up tables for calculating aerial images for all mask features. Various function forms such as the rectangular form and the Gaussian form may be used for the modified k-mask models. The modified k-mask models for one-dimensional features in this quasi-rigorous DDM are referred to as DDM signals.

Figure 6:
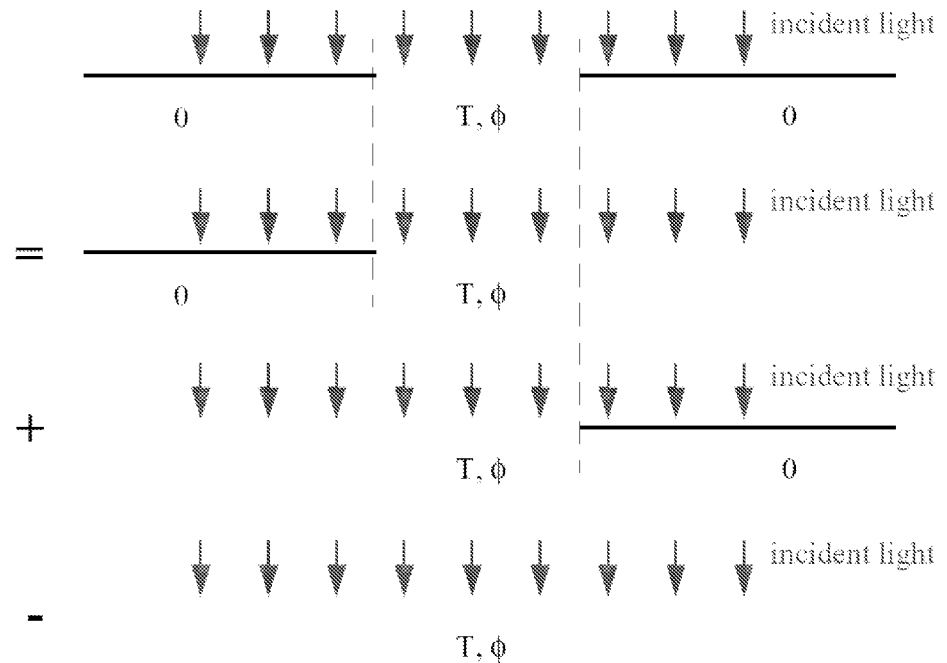
FIG. 6 illustrates an example of a one-dimensional mask opening being decomposed into two edges and a uniform field.

In another quasi-rigorous DDM, referred to as the edge-DDM, each mask feature is decomposed into edges. FIG. 6 illustrates an example of a one-dimensional mask opening being decomposed into two edges and a uniform field. The field across the observation plane (wafer plane) can be obtained based on the scattered fields for the two edges that can be determined by two-dimensional simulations. The application of the edge-DDM in two-dimensional layout features is straightforward. No matter how complicated the mask technology is, usually only a small number of different types of edges are present in the layout. Depending on the orientation of an edge in a layout feature, the edge "sees" and responds to the incident field differently. If the illuminated field is a TE normally incident plane wave and the edge is oriented along the y-axis, it "sees" TE illumination; but if it is oriented along the x-axis, it "sees" TM illumination. The response of each edge to its respective illumination can be taken into account rigorously from a pre-stored two-dimensional edge diffraction simulation. Corner effects may be effectively ignored, since the finite extent of each edge is not rigorously taken into account. Instead, the scattered field at the end points of every edge is abruptly terminated (truncated) in a perfect square-wave fashion to the field value of the k-mask model. Corner effects in typical imaging situations are mapped at the extremities of the spectra and usually do not contribute to the image formation. In this edge-DDM, the two dimensional edge diffraction simulation results are referred to as DDM signals, or more specifically edge-based DDM signals.

The above quasi-DDM methods are described in K. Adam, "Domain Decomposition Methods for the Electromagnetic Simulation of Scattering from Three-Dimensional Structures with Applications in Lithography," Electronics Research Laboratory, University of California, Berkeley, 2001, which is incorporated herein by reference.

DDMs can be applied to modeling the shadowing effect in the EUV lithography because they take into account of three-dimensional electromagnetic field mask effects even though only two-dimensional simulations are performed. The above description of DDMs assumed normally incident plane wave illumination. In the EUV lithography, however, the incident waves are off-axis by approximately 6 degrees in the middle of the illumination area on the mask and span about ±22 degrees (azimuthal angle) on the mask plane from the middle. Thus, an extension of the original DDMs to arbitrary incidence angles is needed. For a horizontal line feature (along the x-axis), different DDM signals are computed for the front edge and the shadow edge. Moreover, the horizontal line "sees" not only TM illumination but also TE illumination except in the middle of the illuminated field. The application of DDMs to arbitrary angles of incidence is discussed in K. Adam and M. C. Lam, "Hybrid Hopkins-Abe Method for Modeling Oblique Angle Mask Effects in OPC," Proceedings of SPIE, Vol. 6924 (2008), which is incorporated herein by reference.

Shadowing Effect Modeling Tools And Methods

Figure 7:
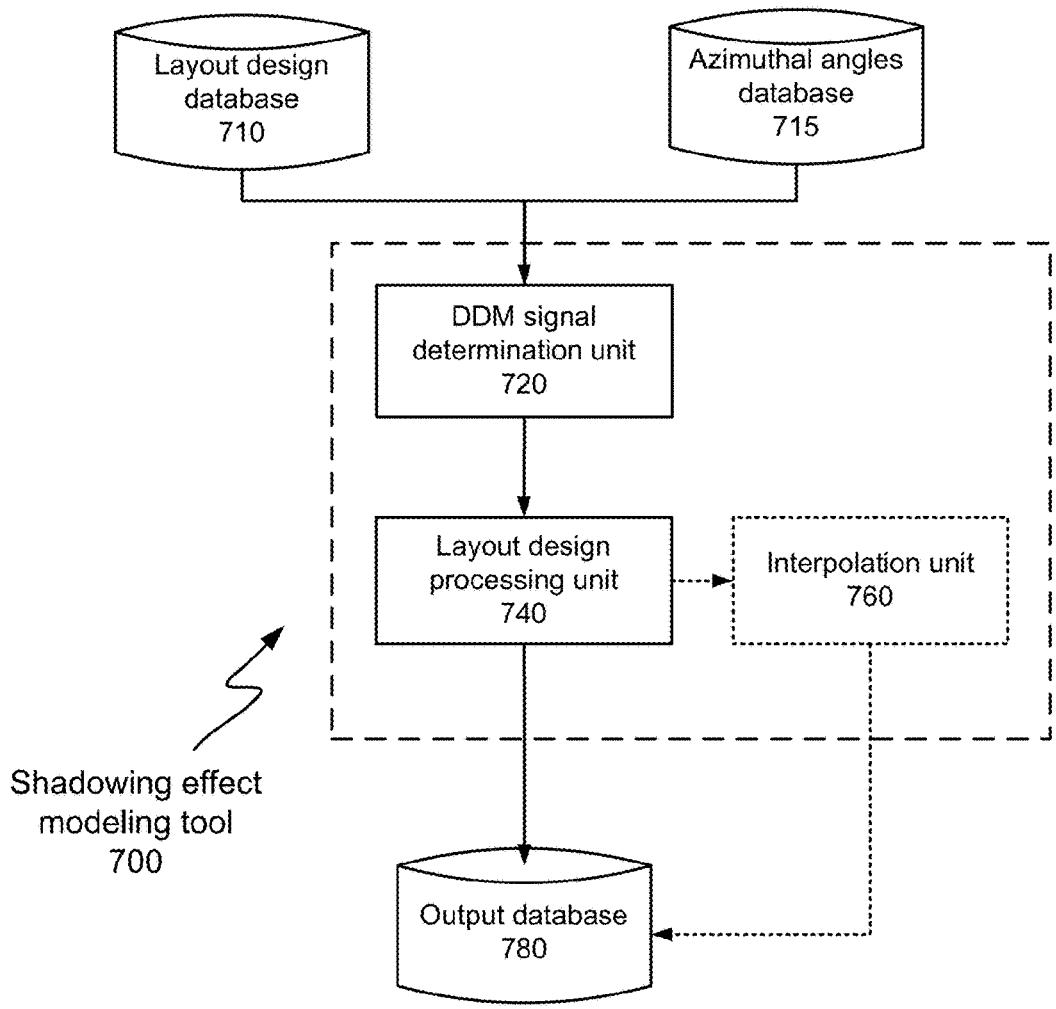
FIG. 7 illustrates an example of a tool for shadowing effect modeling according to various embodiments of the invention.

FIG. 7 illustrates an example of a tool for shadowing effect modeling according to various embodiments of the invention. As seen in the figure, the shadowing effect modeling tool 700 includes two main units: a DDM signal determination unit 720 and a layout design processing unit 740. In some embodiments of the invention, the shadowing effect modeling tool 700 also includes a third unit—an interpolation unit 760. As will be discussed in more detail below, some implementations of the shadowing effect modeling tool 700 may cooperate with (or incorporated) one or more of a layout design database 710, an azimuthal angles database 715, and an output database 780. While these three databases are shown as separate units in FIG. 7, a single computer-readable medium may be used to implement some or all of these databases.

According to some embodiments of the invention, one or more of the DDM signal determination unit 720, the layout design processing unit 740, and the interpolation unit 760 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the DDM signal determination unit 720, the layout design processing unit 740 and the interpolation unit 760. The non-transitory computer-readable medium may be, for example, a magnetic storage device, an optical storage device, a "punched" surface type device, or a solid state storage device. The non-transitory computer-readable medium does not simply propagate electro-magnetic waves.

For ease of understanding, shadowing effect modeling methods that may be employed according to various embodiments of the invention will be described with reference to the shadowing effect modeling tool 700 in FIG. 7. It should be appreciated, however, that alternate implementations of a shadowing effect modeling tool may be used to perform the shadowing effect modeling methods according to various embodiments of the invention. Likewise, the shadowing effect modeling tool 700 illustrated in FIG. 7 may be employed to perform other shadowing effect modeling methods according to various embodiments of the invention.

Figure 4:
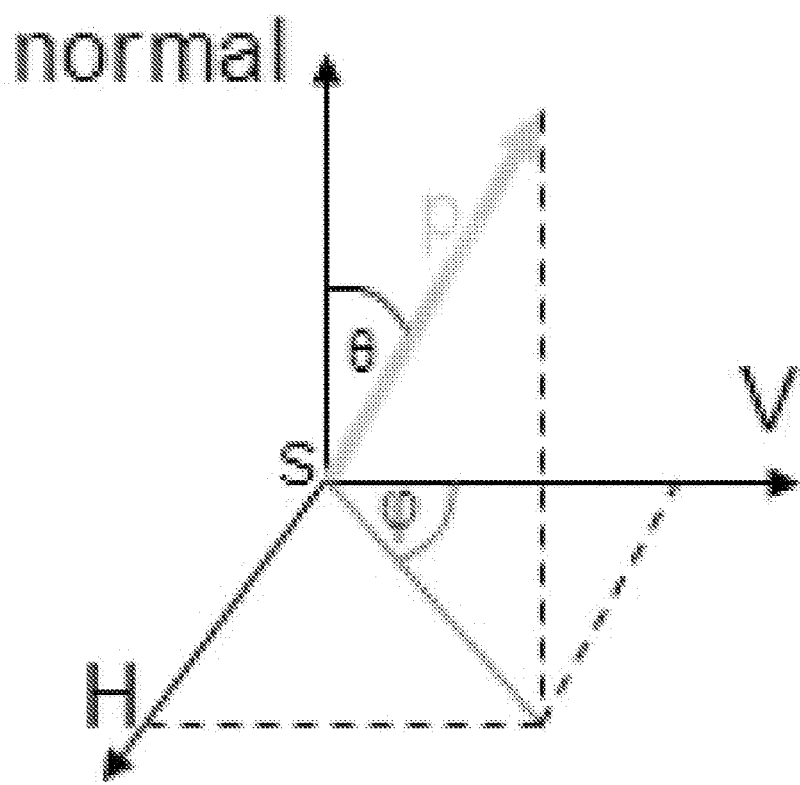
FIG. 4 illustrates a coordinate system for the mask plane and the incident light.

With various implementations of the invention, the DDM signal determination unit 720 is configured to determine a plurality of DDM signals. As previously noted, the EUV lithography system is non-telecentric at the mask plane with the light incident angle spreading over a large range. Thus, layout features on a mask will be illuminated at different angles dependent upon their positions in the illuminated field. To better explaining the shadowing effect modeling methods, FIG. 4 illustrates a coordinate system for the mask plane and the incident light. The mask plane is defined by the axes of H and V, which represent the directions for horizontal and vertical line layout features, respectively. The axis of "normal" is the normal of the mask plane while P coincides with the incident light. For a state-of-the-art EUV lithography system, the inclination angle of illumination $\theta$ is about 6 degrees while the azimuthal angle of illumination $\phi$ spans over ±22 degrees.

For practical applications, only a certain number of azimuthal angles of illumination may be selected for DDM signal determination. The azimuthal angle selection may be based on the mask. When the illuminated field on the mask covers several regions sharing the same layout design, for example, the center of each region may be used for defining an azimuthal angle of illumination. Alternatively or additionally, users may divide the illuminated field into equal sections with one azimuthal angle of illumination determined for each section. It should be noted that these two selection approaches are just examples and are not intended to suggest any limitation as to the scope of use or functionality of the invention.

After receiving the selected azimuthal angles of illumination, the DDM signal determination unit 720 determines a set of DDM signals for each of the selected azimuthal angles. In some embodiments of the invention, the DDM signal determination unit 720 uses a simulation-based method such as those described previously for all the selected azimuthal angles except for those that may be obtained due to symmetry (e.g., the set of DDM signals for $\phi=-10°$ may be obtained directly based on those for $\phi=10°$). In some other embodiments of the invention, DDM signals are determined with a simulation-based method for only a subset of the selected azimuthal angles. These DDM signals may be referred to as simulated DDM signals. For the rest of the selected azimuthal angles, DDM signals may be derived based on the simulated DDM signals. A simple approach that may be employed according to various implementations of the invention is interpolating the simulated DDM signals. The DDM signal determination unit 720 may store all of the determined DDM signals in lookup tables for processing layout data. One type of the determined DDM signals that may be used according to various implementations of the invention is edge-based.

The layout design processing unit 740 is configured to process a layout design based on the DDM signals. Using the DDM signals, the layout design processing unit 740 can determine aerial images for layout features in the layout design. In various embodiments of the invention, the sum-of-coherent-systems (SOCS) method may be used for approximating the Hopkins integral. The basics of the SOCS method is discussed in N. C. Cobb, "Fast Optical and Process Proximity Correction Algorithms for Integrated Circuit Manufacturing," Ph.D. Dissertation, University of California, Berkeley, 1998, which is incorporated herein by reference. The layout design processing unit 740 may also determine printed images for layout features in the layout design with photoresist models. Alternatively or additionally, the layout design processing unit 740 may perform an optical proximity correction (OPC) process on the layout design.

If the illuminated field on the mask covers multiple regions that share the same layout design, the shadowing effect modeling tool 700 may be configured differently. In addition to the DDM signal determination unit 720 and the layout design processing unit 740, a third unit—the interpolation unit 760 may be added into the shadowing effect modeling tool 700. Besides the unit addition, the DDM signal determination unit 720 is configured to determine only DDM signals for a subset of azimuthal angles in the selected azimuthal angles of illumination. The layout design processing unit 740 is configured to process the layout design for the subset of azimuthal angles. Again, the processing operation may comprise one or more of simulating aerial images, simulating printed images, and performing an OPC process. The processing results may comprise aerial image intensities, edge placement errors, or mask displacement. Based on the processing results for the subset of azimuthal angles, the interpolation unit 760 is configured to determine the processing results for the rest azimuthal angles in the selected azimuthal angles. Like determining DDM signals based on the simulated DDM signals, the interpolation unit 760 may apply an interpolation based method.

The shadowing effect modeling tool 700 may store the final results in the output database 780.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of shadowing effect modeling, comprising:
by a computing device:
receiving layout data for one or more layout designs;
receiving information of a plurality of azimuthal angles of illumination;
determining domain decomposition method (DDM) signals for an extreme ultraviolet (EUV) lithography mask to be made based on the one or more layout designs, the DDM signals being grouped into DDM signal sets, each of the DDM signal sets corresponding to a particular azimuthal angle of illumination in the plurality of azimuthal angles of illumination, wherein the determining DDM signals comprises:
dividing the plurality of azimuthal angles of illumination into a first set of azimuthal angles of illumination and a second set of azimuthal angles of illumination;
determining simulated DDM signals for the first set of azimuthal angles of illumination; and
determining interpolated DDM signals for the second set of azimuthal angles of illumination based on the simulated DDM signals;
processing the one or more layout designs based on the DDM signals; and
storing results of the processing the one or more layout designs in a tangible non-transitory medium.

2. The method recited in claim 1, wherein the processing the one or more layout designs comprises performing simulation to generate aerial images or printed images of layout features in the one or more layout designs.

3. The method recited in claim 2, wherein the simulation comprises applying a sum-of-coherent-systems (SOCS) method.

4. The method recited in claim 1, wherein the processing the one or more layout designs comprises performing an optical proximity correction (OPC) process on the one or more layout designs.

5. The method recited in claim 1, wherein the DDM signals are edge-based DDM signals.

6. The method recited in claim 1, further comprising:
after determining the DDM signals, storing the determined DDM signals in lookup tables for processing layout data.

7. A method of shadowing effect modeling, comprising:
by a computing device:
receiving layout data for a layout design;
receiving information of a plurality of azimuthal angles of illumination, the plurality of azimuthal angles of illumination consisting of a first set of azimuthal angles of illumination and a second set of azimuthal angles of illumination;
determining domain decomposition method (DDM) signals for an extreme ultraviolet (EUV) lithography mask to be made based on the layout design, the DDM signals being grouped into DDM signal sets, each of the DDM signal sets corresponding to a particular azimuthal angle of illumination in the first set of azimuthal angles of illumination;
processing the layout design to obtain a first set of processing results for the first set of azimuthal angles of illumination based on the DDM signals;
determining a second set of processing results for the second set of azimuthal angles of illumination based on interpolating the first set of processing results; and
storing the first set of processing results and the second set of processing results in a tangible non-transitory medium.

8. The method recited in claim 7, wherein the first set of processing results and the second set of processing results comprising information of aerial image intensities, edge placement errors, or mask displacement.

9. The method recited in claim 7, wherein the DDM signals are edge-based DDM signals.

10. A non-transitory processor-readable medium storing processor-executable instructions for causing one or more processors to perform a method of shadowing effect modeling, the method comprising:
receiving layout data for one or more layout designs;
receiving information of a plurality of azimuthal angles of illumination;
determining domain decomposition method (DDM) signals for an extreme ultraviolet (EUV) lithography mask to be made based on the one or more layout designs, the DDM signals being grouped into DDM signal sets, each of the DDM signal sets corresponding to a particular azimuthal angle of illumination in the plurality of azimuthal angles of illumination, wherein the determining DDM signals comprises:
dividing the plurality of azimuthal angles of illumination into a first set of azimuthal angles of illumination and a second set of azimuthal angles of illumination;
determining simulated DDM signals for the first set of azimuthal angles of illumination; and determining interpolated DDM signals for the second set of azimuthal angles of illumination based on the simulated DDM signals;

processing the one or more layout designs based on the DDM signals; and storing results of the processing the one or more layout designs in a tangible non-transitory medium.

11. The non-transitory processor-readable medium recited in claim 10, wherein the processing the one or more layout designs comprises performing simulation to generate aerial images or printed images of layout features in the one or more layout designs.

12. The non-transitory processor-readable medium recited in claim 10, wherein the processing the one or more layout designs comprises performing an optical proximity correction (OPC) process on the one or more layout designs.

13. The non-transitory processor-readable medium recited in claim 10, wherein the DDM signals are edge-based DDM signals.

14. The non-transitory processor-readable medium recited in claim 11, wherein the simulation comprises applying a sum-of-coherent-systems (SOCS).

15. A system comprising:
one or more processors, the one or more processors programmed to perform a method of shadowing effect modeling, the method comprising:
receiving layout data for one or more layout designs;
receiving information of a plurality of azimuthal angles of illumination;
determining domain decomposition method (DDM) signals for an extreme ultraviolet (EUV) lithography mask to be made based on the one or more layout designs, the DDM signals being grouped into DDM signal sets, each of the DDM signal sets corresponding to a particular azimuthal angle of illumination in the plurality of azimuthal angles of illumination, wherein the determining DDM signals comprises:
dividing the plurality of azimuthal angles of illumination into a first set of azimuthal angles of illumination and a second set of azimuthal angles of illumination;
determining simulated DDM signals for the first set of azimuthal angles of illumination; and
determining interpolated DDM signals for the second set of azimuthal angles of illumination based on the simulated DDM signals;
processing the one or more layout designs based on the DDM signals; and
storing results of the processing the one or more layout designs in a tangible non-transitory medium.

16. The system recited in claim 15, wherein the processing the one or more layout designs comprises performing simulation to generate aerial images or printed images of layout features in the one or more layout designs.

17. The system recited in claim 15, wherein the processing the one or more layout designs comprises performing an optical proximity correction (OPC) process on the one or more layout designs.

18. The system recited in claim 15, wherein the DDM signals are edge-based DDM signals.

19. The system recited in claim 16, wherein the simulation comprises applying a sum-of-coherent-systems (SOCS).

20. The system recited in claim 16, further comprising: after determining the DDM, signals, storing the determined DDM signals in lookup tables for processing layout data.

* * * * *